(12) United States Patent
Lee (10) Patent No.: US 9,960,060 B2
(45) Date of Patent: May 1, 2018

(54) PLATEN ASSEMBLY

(71) Applicant: VARIAN SEMICONDUCTOR EQUIPMENT ASSOCIATES, INC., Gloucester, MA (US)

(72) Inventor: William Davis Lee, Newburyport, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 341 days.

(21) Appl. No.: 14/511,342

(22) Filed: Oct. 10, 2014

(65) Prior Publication Data

US 2016/0104634 A1 Apr. 14, 2016

(51) Int. Cl.
  *H05B 3/68* (2006.01)
  *C23C 16/00* (2006.01)
  *H01L 21/67* (2006.01)
  *H01L 21/683* (2006.01)

(52) U.S. Cl.
  CPC .. *H01L 21/67103* (2013.01); *H01L 21/67109* (2013.01); *H01L 21/6831* (2013.01)

(58) Field of Classification Search
  CPC ......... H01L 21/67103; H01L 21/67109; H01L 21/6831; H01L 21/6833; H05B 3/20–3/267; H05B 3/28–3/30
  USPC .................... 219/443.1–468.2; 118/724, 725
  See application file for complete search history.

(56) References Cited

U.S. PATENT DOCUMENTS

| | | | | |
|---|---|---|---|---|
| 5,155,652 A | * | 10/1992 | Logan | H01L 21/6831 279/128 |
| 5,376,213 A | * | 12/1994 | Ueda | C23C 16/4586 156/345.27 |
| 5,835,334 A | * | 11/1998 | McMillin | H01L 21/6833 279/128 |
| 6,646,233 B2 | * | 11/2003 | Kanno | H01L 21/6831 118/724 |
| 6,951,587 B1 | * | 10/2005 | Narushima | C23C 16/4586 118/728 |

OTHER PUBLICATIONS

Fish, Roger B., et al., System and Apparatus for Holding a Substrate Over Wide Temperature Range, filed as U.S. Appl. No. 14/275,779, filed May 12, 2014.

* cited by examiner

*Primary Examiner* — Sang Y Paik
(74) *Attorney, Agent, or Firm* — Nields, Lemack & Frame, LLC (57) ABSTRACT

A platen assembly includes a base and a clamping layer fixed to the base. A portion of the base that faces the clamping layer and a portion of the clamping layer that faces the base define a gap between the base and the clamping layer. The gap is configured to circulate a fluid during a first operating mode and provide a thermal break during a second operating mode. The platen assembly is capable of operating over a wide temperature range.

18 Claims, 5 Drawing Sheets

PLATEN ASSEMBLY

FIELD

The present embodiments relate to a platen assembly, and more particularly, to a platen assembly capable of operating over a wide temperature range.

BACKGROUND

Platen assemblies such as electrostatic clamps are used widely for many manufacturing processes including semiconductor manufacturing, solar cell manufacturing, and processing of other components. Many substrates such as semiconductor wafers may be subject to processing over a wide range of substrate temperatures, such as between −100° C. and 750° C. For example, during an ion implant process into a semiconductor wafer it may be desirable to perform a first ion implant while the substrate is maintained at room temperature or at a lower temperature down to −100° C. It may also be desirable to conduct a second implant into the same substrate at an elevated temperature such as at 500° C. or above. In order to accommodate both implantation processes in the same ion implanter without undue complexity and expense of time, it may be desirable that a single platen assembly function both at room temperature and at elevated temperatures. However present day platen assemblies may not be suitable for operation over a wide substrate temperature range, such as between −100° C. and 750° C. This is in part due to thermal properties of components of the platen assembly as well as the substrate, in which differences in coefficient of thermal expansion among components may generate large internal stresses. This problem is exacerbated as the size of substrates scales up to larger dimensions. Accordingly, it is common practice to employ a dedicated platen assembly for operation at high substrate temperature, and a dedicated platen assembly to operate at room temperature or below.

It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a platen assembly is provided. The platen assembly includes a base and a clamping layer fixed to the base, where a portion of the base that faces the clamping layer and a portion of the clamping layer that faces the base define a gap between the base and the clamping layer. The gap is configured to circulate a fluid during a first operating mode and provide a thermal break during a second operating mode.

In another embodiment, a clamp system for supporting a substrate is provided. The clamp system includes a platen assembly, a thermal unit, and a vacuum system. The platen assembly includes a base and a clamping layer fixed to the base, where a portion of the base that faces the clamping layer and a portion of the clamping layer that faces the base define a gap between the base and the clamping layer. The thermal unit is configured to provide a fluid to the gap during a first operating mode and to remove the fluid from the gap before operation in a second operating mode. The vacuum system is configured to generate a pressure in the gap during the second operating mode to cause a thermal conduction between the base and the clamping layer to be less in the second operating mode than in the first operating mode.

In a further embodiment, a method of operating a platen assembly over a wide temperature range includes: providing a gap in the platen assembly having a base fixed to a clamping layer, the gap defined by a portion of the base that faces the clamping layer and a portion of the clamping layer that faces the base; circulating a fluid in the gap during a first operating mode; removing the fluid from the gap after completion of the first operating mode; heating the clamping layer for operation during a second operating mode; and generating a pressure in the gap for operation during the second operating mode to cause a thermal conduction between the base and the clamping layer to be less in the second operating mode than in the first operating mode

DETAILED DESCRIPTION

The embodiments described herein provide a platen assembly and a clamp system for holding substrates over a wide temperature range. Platen assemblies are provided that facilitate operation at room temperature and below room temperature, as well as at elevated temperatures. Various embodiments provide a base that is fixed to a clamping layer. A portion of the base that faces the clamping layer and a portion of the clamping layer that faces the base define a gap. The gap provides a dual function of circulating a fluid during a first operating mode and providing a thermal break during a second operating mode.

Figures 1A, 1B:
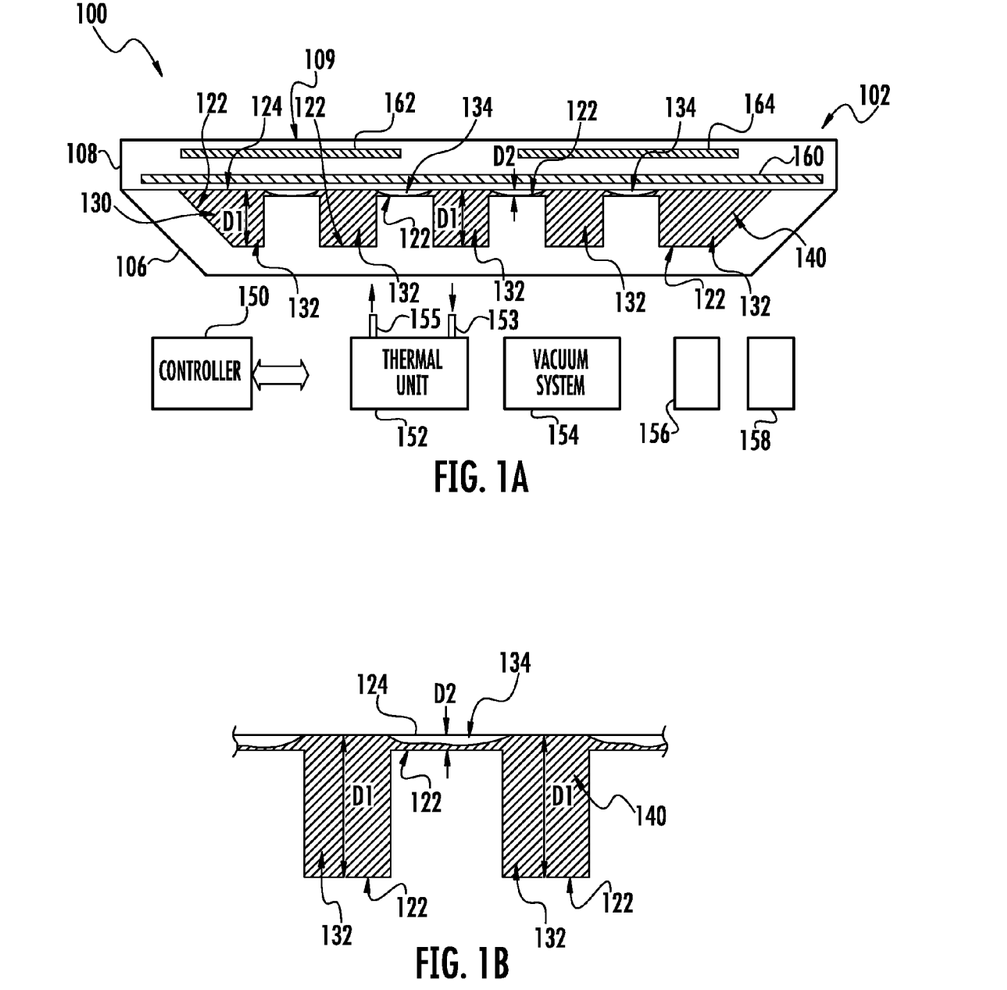
FIG. 1A depicts a clamp system consistent with an embodiment of the disclosure including a cross sectional side view of a platen assembly in a first operating mode.
FIG. 1B depicts a magnified view of a portion of the platen assembly of FIG. 1A.

Turning to FIG. 1A, a clamp system 100 consistent with an embodiment of the disclosure is illustrated. The clamp system 100 may be suitable for various processing tools in which it is desirable to securely clamp a substrate and provide active cooling or heating to the substrate. Such processing tools include, but are not limited to, ion implantation, etch, and deposition tools.

The clamp system 100 includes a cross sectional side view of platen assembly 102. The platen assembly 102 includes a base 106 fixed to a clamping layer 108. The base 106 may be fabricated from metal or a metal alloy, including, but not limited to, aluminum. The clamping layer 108 may be fabricated from an insulating or semiconducting material. The clamping layer 108 may be a ceramic material including, but not limited to, alumina or aluminum nitride. The clamping layer 108 has a clamping surface 109 to which a substrate (not illustrated) is clamped. The clamping surface 109 may have a disk shape to accommodate a disk shaped substrate such as a semiconductor wafer. The semiconductor wafer may have a diameter of 300 millimeters (mm) or other diameter sizes. The clamping layer 108 may also include a heating element 160 and a plurality of electrodes 162, 164 for electrostatic clamping. The heating element 160 may include a resistive heating element that is farther from the clamping surface 109 than the electrodes 162, 164.

Advantageously, a portion 122 of the base 106 that faces the clamping layer 108 and a portion 124 of the clamping layer 108 that faces the base 106 define a gap 130. In the embodiment illustrated in FIG. 1A, the base 106 is joined to the clamping layer 108 only at the perimeter of each to minimize physical contact between the base 106 and the clamping layer 108. This limited physical contact limits thermal conduction between the base 106 and the clamping layer 108 and thus out of the platen assembly 102. Selected other points, such as a center portion, may be needed to fix the base 106 to the clamping layer 108 but these can be minimized to reduce thermal loss at those points.

The gap 130 may include a flow channel 132 and a flow divider area 134 in remaining areas of the gap 130 that are not the flow channel 132. The cross sectional shape of the flow channel 132 may be a rectangular shape, a square shape, a circular shape, or any other variety of shapes. The flow channel 132 has a first maximum distance (D1) between the portion 122 of the base 106 and the portion 124 of the clamping layer 108 that defines the gap 130. The flow divider area 134 has a second maximum distance (D2) between the portion 122 of the base 106 and the portion 124 of the clamping layer 108 that defines the gap 130. The first maximum distance (D1) is greater than the second maximum distance (D2). In some embodiments, the first maximum distance (D1) is at least 10 times greater than the second maximum distance (D2). In one embodiment, the first maximum distance (D1) is about 3-5 millimeters (mm) and the second maximum distance (D2) is about 0.1 mm and the diameter of the clamping surface 109 is slightly larger than 300 mm to accommodate a 300 mm diameter semiconductor wafer. In another instance, the diameter of the clamping surface 109 may be slightly smaller than 300 mm to accommodate a 300 mm diameter semiconductor wafer while protecting the platen assembly from exposure to a process being performed on a substrate clamped thereto.

The clamp system 100 may also include a controller 150, a thermal unit 152, a vacuum system 154, a clamping power supply 156, and a heater power supply 158. The controller 150 can be or include a general-purpose computer or network of general-purpose computers that may be programmed to perform desired input/output functions. The controller 150 can also include other electronic circuitry or components, such as application specific integrated circuits, other hardwired or programmable electronic devices, discrete element circuits, etc. The controller 150 may also include communication devices, data storage devices, and software. The controller 150 may receive input signals from a variety of systems and components such as the thermal unit 152, the vacuum system 154, the clamping power supply 156, the heater power supply 158, etc. and provide output signals to each to control the same.

The thermal unit 152 may include a cooling mechanism such as a closed loop gas chiller, a water cooled heat exchanger, etc. to provide for desired cooling of a fluid that is circulated through the flow channel 132 in the gap 130 during a first operating mode. The thermal unit 152 may also include a heating mechanism to provide for desired heating of the fluid. The fluid may be in liquid or gaseous form. The selection of the fluid depends primarily on the desired range of operating temperatures for a substrate clamped to the platen assembly 102. In some instances, the fluid may be deionized water for operation at room temperature and slightly below room temperature. For even colder temperatures, the fluid may include liquid nitrogen or other such coolants. For slightly elevated temperatures the fluid may include heated oils or gases. The thermal unit 152 may include an ingress pipe 153 for receiving a fluid at one temperature that was circulated through the flow channel 132 and an egress pipe 155 for returning a fluid at a desired temperature back to the flow channel 132 in a closed loop configuration. The vacuum system 154 may include one or more vacuum pumps such as turbo molecular pumps and roughing pumps and associated valves and pressure sensors to generate a desired pressure in the gap 130. The vacuum system 154 may also include vacuum pumps that are part of an end station of a processing tool housing the clamp system 100 such as an ion implanter.

The clamping power supply 156 may provide a clamping signal to the pair of electrodes 162, 164. The clamping signal may be an AC voltage signal to provide an electrostatic clamping force to secure a substrate to the clamping surface 109 of the clamping layer 108. Although only one pair of electrodes 162, 164 is illustrated, the clamping layer 108 may include three pairs of electrodes where each pair receives an AC signal that is 120 degrees out of phase with the other pairs of electrodes. Other embodiments may include a DC voltage signal to provide the electrostatic clamping force. The heater power supply 158 may provide a voltage signal to the heating element 160 to heat the clamping layer 108 and hence a substrate clamped thereto to a desired hot temperature during a second operating mode.

In operation, a desired temperature or temperature range is determined by the controller 150. For example, this may be in response to a particular recipe input by a user of a tool employing the clamp system 100. Based on the desired temperature or temperature range, the controller 150 may generally operate the platen assembly 102 in either a first operating mode or a second operating mode. The first operating mode includes different cooler substrate temperature ranges from about room temperature to below room temperature such as between 25° C. to −100° C. The first operating mode may also include slightly elevated temperatures compared to room temperature. The second operating mode includes relatively hotter substrate temperature ranges from about 100° C. to 750° C.

In the first operating mode which is illustrated in FIG. 1A, the controller 150 instructs the thermal unit 152 to provide a fluid 140 to the gap 130. The fluid 140 flows out the egress pipe 155 and into the flow channel 132 of the gap 130. The fluid 140 is circulated through the flow channel 132 to provide desired temperature regulation for a substrate positioned on the clamping surface 109 of the clamping layer 108 which includes cooling in one embodiment.

FIG. 1B illustrates a magnified view of a portion of the flow channel 132 and flow divider area 134 during the first operating mode with a fluid 140 flowing through the flow channel 132. As illustrated, the fluid 140 may flow predominantly through the flow channel 132 compared to the flow divider area 134 by selection of the dimensions of the flow channel 132 and the flow divider area 134. As illustrated, this may enable the fluid 140 to have minimal contact to the portion 124 of the clamping layer 108 defining the gap 130 in the flow divider area 134. This keeps most of the fluid flowing through the flow channel 132 and to and from the thermal unit 152. In this way, the thermal unit 152 and flow channel 132 operate at higher efficiency compared to excess amounts of fluid becoming stagnant in the flow divider area 134. As earlier detailed, the first maximum distance (D1) of the flow channel 132 may be at least 10 times greater than the second maximum distance (D2) of the flow divider area 134. In one embodiment, the first maximum distance (D1) is about 3-5 millimeters (mm) and the second maximum distance (D2) is about 0.1 mm. To further facilitate heat transfer between the clamping layer 108 and a substrate clamped to the clamping surface 109, a backside gas may be provided between the clamping surface 109 and the substrate. The backside gas may be helium, neon, argon, nitrogen or other gas species or combination of gas species.

Figure 1C:
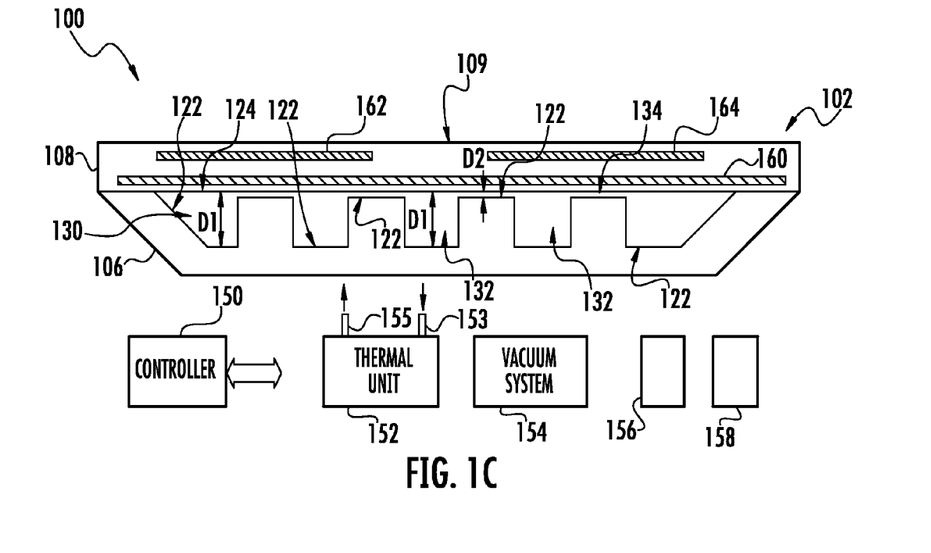
FIG. 1C depicts a cross sectional side view of the platen assembly of FIG. 1A in a second operating mode.

Turning to FIG. 1C, a cross sectional side view of the platen assembly 102 operating in a second mode is illustrated. After operation in the first operating mode (FIG. 1A), the controller 150 may instruct the start of a second operating mode. In response, the thermal unit 152 removes the fluid 140 from the gap 130. Once fluid is removed from the gap 130, the vacuum system 154 is configured to generate a pressure in the gap 130 to limit thermal conduction between the clamping layer 108 and the base 106. This provides a thermal break between the clamping layer 108 and the base 106. There is only radiative heat transfer and conductive heat transfer along the base 106 which represents a structure with a poor heat transfer coefficient thus thermally insulating the clamping layer 108 from the base 106.

The heater power supply 158 may supply a voltage signal to the heating element 160 to elevate the temperature of the clamping layer 108 to a desired hotter temperature, e.g., between 100° C. to 750° C. Although the embodiment of FIG. 1A illustrates a heating element 160 internal to the clamping layer 108, an external heating element may be used to provide heat directly to a substrate supported on the clamping surface 109. For example, an external heating element may include one or more lamps to provide heat. In general, a pressure approaching a vacuum condition in the gap 130 helps minimize convection and conductive heat transfer between the clamping layer 108 and the base 106, leaving only radiative heat transfer, and thus substantially reducing heat loss. In one embodiment, the vacuum system 154 may generate a pressure of less than 1 millitorr (mTorr) in the gap 130 during the second operating mode.

Figure 2:
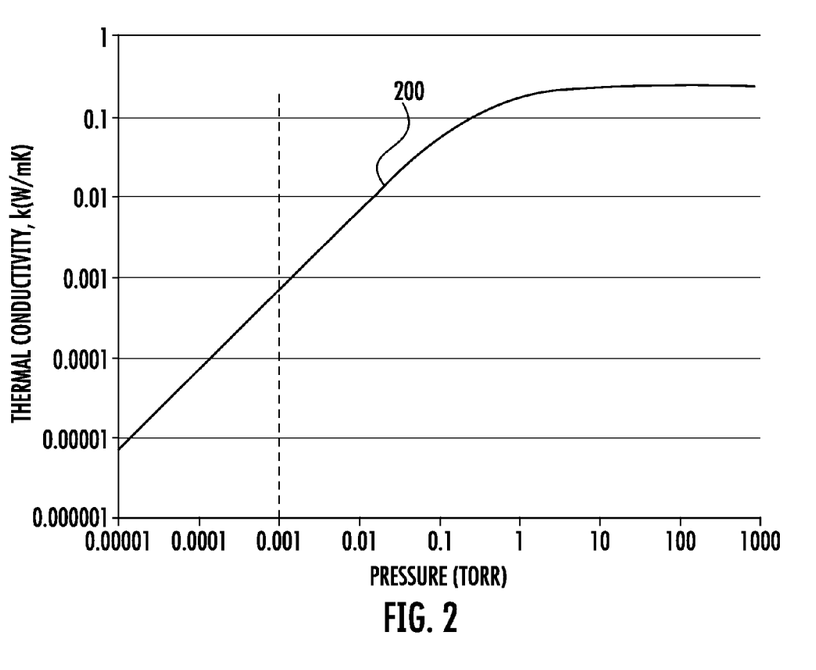
FIG. 2 depicts a plot of thermal conductivity versus pressure.

Turning to FIG. 2, a plot 200 of thermal conductivity (k) in Watts per meter kelvin (W/mK) versus pressure in Torr is illustrated. In general, as the pressure is lowered less than about 1 Torr, the thermal conductivity (k) is lowered. At a pressure of 0.001 Torr or 1 mTorr, the thermal conductivity is reduced to less than 0.001 W/mK as illustrated in FIG. 2. Accordingly, by lowering the pressure in the gap 130 during operation in the second operating mode when a comparatively hotter operating temperature range is desired, the gap 130 provides a thermal break between the hot clamping layer 108 and the relatively cooler base 106.

Figure 3:
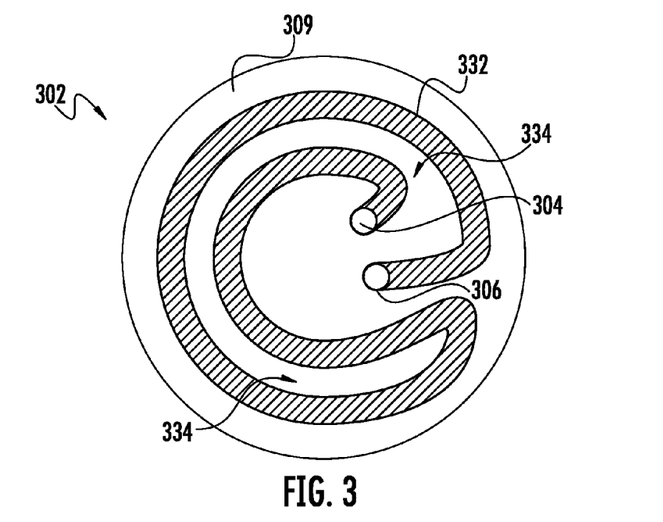
FIG. 3 depicts a top view of a platen assembly consistent with an embodiment to illustrate one configuration of a flow channel.

Turning to FIG. 3, a top view of a platen assembly 302 consistent with an embodiment is shown to illustrate one configuration of a flow channel 332 and a surrounding flow divider area 334. The flow channel 332 underneath the clamping surface 309 has an input 304 that receives fluid from the egress pipe 155 of the thermal unit 152 and an output 306 to deliver fluid back to the thermal unit 152 via the ingress pipe 153. The flow channel 332 may follow a circuitous path as illustrated in FIG. 3 to facilitate a desired cooling ability for operation in the first operating mode. Other flow channels may include many different circuitous paths so the example in FIG. 3 is but one of many examples.

Figure 4A:
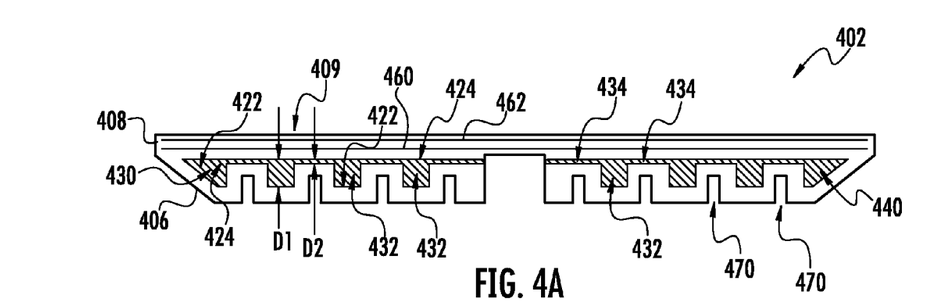
FIG. 4A depicts a cross sectional side view of platen assembly consistent with another embodiment of the disclosure in a first operating mode.
Figure 4B:
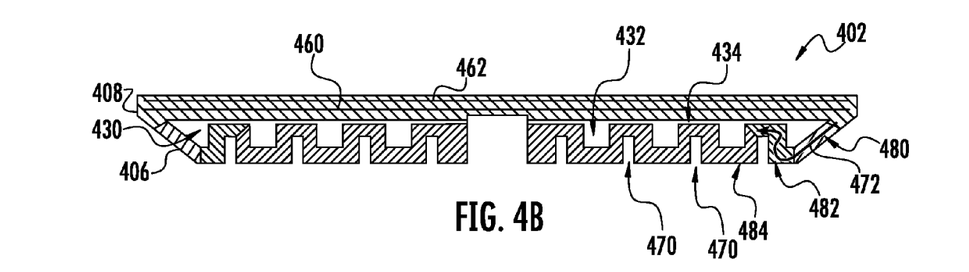
FIG. 4B depicts a cross sectional side view the platen assembly of FIG. 4A in a second operating mode.

Turning to FIGS. 4A and 4B, a platen assembly 402 consistent with another embodiment is illustrated. The platen assembly 402 includes a base 406 fixed to a clamping layer 408. In this embodiment, the base 406 is fixed to the clamping layer 408 at the perimeter of the platen assembly 402 and also in the center. A portion 422 of the base 406 that faces the clamping layer 408 and a portion 424 of the clamping layer 408 that faces the base 406 define a gap 430. The gap 430 includes a flow channel 432 and a flow divider area 434 in remaining areas of the gap 430 that are not the flow channel 432. The clamping layer 408 may include a heating element 460 to heat the clamping layer 408 during the second operating mode. The clamping layer 408 may also include an electrode 462 or a plurality of electrodes to receive a clamping signal and provide an electrostatic clamping force to clamp a substrate to a clamping surface 409 of the clamping layer 408. The base 406 in this embodiment includes recessed portions 470 to advantageously increase a thermal conduction path length along the base 406.

FIG. 4A illustrates operation of the platen assembly 402 in a first operating mode to facilitate cooling of a substrate clamped to the clamping surface 409 to a cooler temperature ranges such as between 25° C. to −100° C. In this first operating mode, a fluid 440 is provided to the flow channel 432 to facilitate cooling of the substrate. The relative dimensions of the flow channel and the flow divider area (e.g., D1>>D2 in this instance) can be selected as earlier detailed to minimize the amount of fluid 440 that may leak from the flow channel 432 into the flow divider area 434.

FIG. 4B illustrates operation of the platen assembly 402 in a second operating mode to facilitate heating of a substrate clamped to the clamping surface 409 to a hotter temperature range such as between 100° C. to 750° C. The fluid previously present in the flow channel 432 during the first operating mode (FIG. 4A) has been removed. The gap 430 provides a thermal break between the clamping layer 408 and the base 406 and reducing the pressure in this gap helps to control the efficiency of the thermal break. When the clamping layer 408 is heated by the heating element 460, thermal conduction away from the clamping layer 408 is limited to radiative heat transfer and conductive heat transfer along the base 406. Advantageously, the plurality of recessed portions 470 in the base 406 causes the conductive heat transfer to follow a serpentine path 472 about the base 406. This serpentine path 472 provides a longer path for conductive heat transfer across the base 406. The different regions 480, 482, 484 represent different regions of the base 406 intended to show a thermal gradient across the base from hotter to cooler temperatures.

Figure 5A:
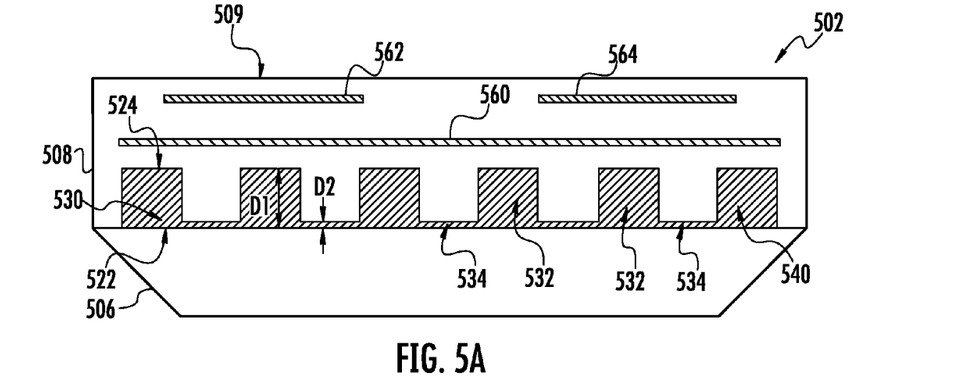
FIG. 5A depicts a cross sectional side view of platen assembly consistent with yet another embodiment of the disclosure in a first operating mode.
Figure 5B:
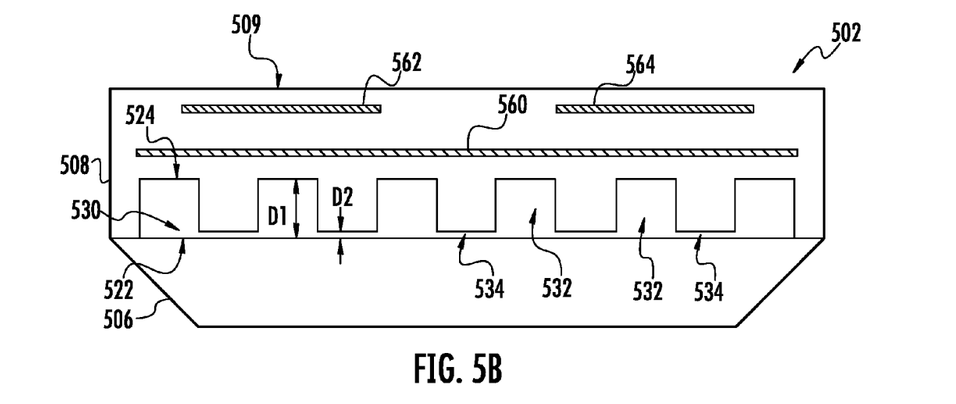
FIG. 5B depicts a cross sectional side view the platen assembly of FIG. 5A in a second operating mode.

Turning to FIGS. 5A and 5B, a platen assembly 502 consistent with another embodiment is illustrated. In this embodiment, a portion 524 of the clamping layer 508 facing the base 506 that defines the gap 530 is recessed compared to an outer portion of the clamping layer 508. Furthermore, the portion 522 of the base 506 facing the clamping layer 508 that also defines the gap 530 has a planar shape.

The gap 530 includes a flow channel 532 and a flow divider area 534 in remaining areas of the gap 530 that are not the flow channel 532. The clamping layer 508 may include a heating element 560 to heat the clamping layer 508 during the second operating mode. The clamping layer 508 may also include a pair of electrodes 562, 564 to receive a clamping signal and provide an electrostatic clamping force to clamp a substrate to the clamping surface 509 of the clamping layer 508.

FIG. 5A illustrates operation of the platen assembly 502 in a first operating mode to facilitate cooling of a substrate clamped to the clamping surface 509 to a cooler temperature ranges such as between 25° C. to −100° C. In this first operating mode, a fluid 540 is provided to the flow channel 532 to facilitate cooling of the substrate clamped to the clamping surface 509. The relative dimensions of the flow channel and the flow divider area (e.g., D1>>D2 in this instance) can be selected as earlier detailed to minimize the amount of fluid that may leak from the flow channel 532 into the flow divider area 534. In operation, the platen assembly 502 may be rotated orthogonal to its position illustrated in FIG. 5A during a processing step.

FIG. 5B illustrates operation of the platen assembly 502 in a second operating mode to facilitate heating of a substrate clamped to the clamping surface 509 to a hotter temperature range such as between 100° C. to 750° C. The fluid previously present in the flow channel 532 during the first operating mode (FIG. 5A) has been removed. The gap 530 provides a thermal break between the clamping layer 508 and the base 506 and reducing the pressure in this gap helps to control the efficiency of the thermal break. When the clamping layer 508 is heated by the heating element 560, thermal conduction away from the clamping layer 508 is limited to radiative heat transfer and conductive heat transfer along the base 506.

Accordingly, there has been provided a platen assembly having a clamping layer fixed to a base. A portion of the base that faces the clamping layer and a portion of the clamping layer that faces the base define a gap between the clamping layer and the base. The gap is configured to circulate a fluid during a first operating mode and provide a thermal break during a second operating mode. The amount of physical contact between the base and the clamping layer may be minimized to increase the size of the gap and limit thermal conduction between the base and the clamping layer and thus out of the platen assembly.

Advantageously, the gap therefore provides a dual function during each of these different operating modes. The platen assembly is therefore able to operate over a wide temperature range. In the first operating mode, the platen assembly may adjust the temperature of a substrate clamped thereto to cooler temperatures between 25° C. to −100° C. The first operating mode may also include slightly elevated temperatures compared to room temperature. During the second operating mode, the platen assembly may adjust the temperature of a substrate clamped thereto to comparatively hotter temperatures of between 100° C. to 750° C.

There has also been provided a method of operating a platen over a wide temperature range that includes: providing a gap in a platen having a base fixed to a clamping layer, the gap defined by a portion of the base that faces the clamping layer and a portion of the clamping layer that faces the base; circulating a fluid in the gap during a first operating mode; removing the fluid from the gap after completion of the first operating mode; heating the clamping layer for operation during a second operating mode; and generating a pressure in the gap for operation during the second operating mode to cause a thermal conduction between the base and the clamping layer to be less, or substantially less, in the second operating mode than in the first operating mode. In one embodiment, the pressure is less than 1 millitorr in the gap during the second operating mode.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A platen assembly comprising:
a base; and
a clamping layer fixed to the base, where a portion of the base that faces the clamping layer and a portion of the clamping layer that faces the base defines a gap between the base and the clamping layer, the gap configured to circulate a fluid during a first operating mode and provide a thermal break during a second operating mode, wherein the gap comprises an input, an output, a flow channel configured to receive the fluid during the first operating mode, and a flow divider area in remaining areas of the gap that are not the flow channel, where the flow divider area creates spacing between adjacent segments of the flow channel and is dimensioned such that there is no physical contact between the base and clamping layer, and wherein fluid enters the gap via the input, circulates predominantly through the flow channel compared to the flow divider area and exits via the output during the first operating mode.

2. The platen assembly of claim 1, wherein the flow channel has a first maximum distance between the portion of the base and the portion of the clamping layer defining the gap, and the flow divider area has a second maximum distance between the portion of the base and the portion of the clamping layer defining the gap, wherein the first maximum distance is greater than the second maximum distance.

3. The platen assembly of claim 2, wherein the first maximum distance is at least 10 times greater than the second maximum distance.

4. The platen assembly of claim 3, wherein the first maximum distance is between 3 and 5 millimeters (mm) and the second maximum distance is 0.1 mm.

5. The platen assembly of claim 1, wherein the portion of the base defining the gap is recessed compared to an outer portion of the base and the portion of the clamping layer defining the gap has a planar shape.

6. The platen assembly of claim 5, wherein a surface of the base opposite the portion of the base defining the gap comprises recessed portions so conductive heat transfer about the base in the second operating mode follows a serpentine path about the base.

7. The platen assembly of claim 1, wherein the portion of the clamping layer defining the gap is recessed compared to an outer portion of the clamping layer and the portion of the base defining the gap has a planar shape.

8. A clamp system for supporting a substrate comprising:
a platen assembly comprising a base and a clamping layer fixed to the base, where a portion of the base that faces the clamping layer and a portion of the clamping layer that faces the base defines a gap between the base and the clamping layer, wherein the gap comprises an input, an output and a flow channel configured to receive the fluid during the first operating mode, and a flow divider area in remaining areas of the gap that are not the flow channel, where the flow divider area creates spacing between adjacent segments of the flow channel, and wherein fluid enters the gap via the input, circulates through the flow channel and exits via the output during the first operating mode;
a thermal unit in communication with the input and the output and configured to circulate the fluid through the flow channel in the gap during a first operating mode and to remove the fluid from the gap before operation in a second operating mode; and
a vacuum system configured to generate a pressure in the gap during the second operating mode to cause a thermal conduction between the base and the clamping layer to be less in the second operating mode than in the first operating mode.

9. The clamp system of claim 8, wherein the clamping layer comprises a heating element to heat the clamping layer during the second operating mode, and wherein the pressure in the gap is less than 1 millitorr (mTorr) during the second operating mode.

10. The clamp system of claim 8, wherein the flow channel has a first maximum distance between the portion of the base and the portion of the clamping layer defining the gap, and the flow divider area has a second maximum distance between the portion of the base and the portion of the clamping layer defining the gap, wherein the first maximum distance is greater than the second maximum distance.

11. The clamp system of claim 10, wherein the first maximum distance is at least 10 times greater than the second maximum distance.

12. The clamp system of claim 11, wherein the first maximum distance is between 3 and 5 millimeters (mm) and the second maximum distance is 0.1 mm.

13. The clamp system of claim 8, wherein the portion of the base defining the gap is recessed compared to an outer portion of the base and the portion of the clamping layer defining the gap has a planar shape.

14. The clamp system of claim 13, wherein a surface of the base opposite the portion of the base defining the gap includes recessed portions so conductive heat transfer about the base in the second operating mode follows a serpentine path about the base.

15. The clamp system of claim 8, wherein the thermal unit maintains the fluid at a desired temperature as the fluid circulates in the gap during the first operating mode.

16. A method of operating a platen assembly over a wide temperature range, comprising:
providing a gap in the platen assembly having a base fixed to a clamping layer, the gap defined by a portion of the base that faces the clamping layer and a portion of the clamping layer that faces the base and wherein the gap comprises an input, an output, a flow channel configured to receive the fluid during the first operating mode, and a flow divider area in remaining areas of the gap that are not the flow channel, where the flow divider area creates spacing between segments of the flow channel;
circulating a fluid in the gap during a first operating mode, wherein the fluid enters the gap via the input, circulates through the flow channel and exits via the output, where a temperature of the fluid is maintained at a desired temperature as the fluid is circulated;
removing the fluid from the gap after completion of the first operating mode;
heating the clamping layer for operation during a second operating mode; and
generating a pressure in the gap for operation during the second operating mode to cause a thermal conduction between the base and the clamping layer to be less in the second operating mode than in the first operating mode.

17. The method of claim 16, wherein the pressure in the gap is less than 1 millitorr (mTorr) during the second operating mode.

18. The method of claim 16, wherein the fluid exits the gap and passes through a thermal unit, which maintains the desired temperature of the fluid.

* * * * *